United States Patent
Chen

(10) Patent No.: US 7,691,206 B2
(45) Date of Patent: Apr. 6, 2010

(54) WAFER CLEANING PROCESS

(75) Inventor: Bor-Ren Chen, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 915 days.

(21) Appl. No.: 11/223,165

(22) Filed: Sep. 8, 2005

(65) Prior Publication Data

US 2007/0054491 A1    Mar. 8, 2007

(51) Int. Cl.
*B08B 3/12* (2006.01)
*C25F 1/00* (2006.01)

(52) U.S. Cl. ............................................. 134/1; 134/1.3

(58) Field of Classification Search ....................... None
See application file for complete search history.

(56) References Cited

U.S. PATENT DOCUMENTS

| | | | | |
|---|---|---|---|---|
| 5,980,647 | A | * 11/1999 | Buker et al. | 134/33 |
| 6,858,091 | B2 | * 2/2005 | Boyd et al. | 134/26 |
| 2004/0079395 | A1 | * 4/2004 | Kim et al. | 134/30 |

* cited by examiner

*Primary Examiner*—Duy-Vu N Deo
(74) *Attorney, Agent, or Firm*—J.C. Patents

(57) ABSTRACT

The invention is directed to a wafer cleaning process for being applied on a wafer after an etching process is performed on the wafer, wherein the wafer has a wafer center, a wafer radius and a wafer circumference. The wafer cleaning process comprises a step of dispensing a cleaning solution over the wafer by using a dispenser while the dispenser is moving back and forth along a swing path over the wafer around the wafer center, wherein the wafer center is projected to a midpoint of the swing path.

13 Claims, 4 Drawing Sheets

WAFER CLEANING PROCESS

BACKGROUND OF THE INVENTION

1. Field of Invention

The present invention relates to a semiconductor process. More particularly, the present invention relates to a method for cleaning polymer residues on a wafer.

2. Description of Related Art

In the semiconductor process, the patterning process of a material layer usually includes a photolithography process for forming a patterned photoresist layer and an etching process with the use of the patterned photoresist layer as an etching mask. Since the photoresist layer is made of organic material, the etching residue often remains on the substrate so as to induce a lot of process problems. In the damascene process, especially for the metal hard mask layer used as the etching mask, the etching residue, which seriously affects the later performed process, remains on the sidewall of the damascene opening after the etching process is performed. In the later performed semiconductor process, if the etching residue is not properly removed, the residue will affect the later performed process steps and further decrease the quality of the metal interconnects.

In order to solve the problem of leaving the etching residue on the substrate, in the conventional manufacturing process, a wet clean process is performed with the use of the surfactant to remove the etching residue from the substrate. However, as to the process for forming the damascene opening with the use of the metal hard mask layer, it is hard to clean out the etching residue remaining on the sidewall of the damascene opening formed on the substrate. Hence, the quality of the metal interconnects is dramatically affected and the yield is decreased as wall.

SUMMARY OF THE INVENTION

Accordingly, at least one objective of the present invention is to provide a wafer cleaning process capable of effectively cleaning out the etching residue remaining on the surface of the wafer after the etching process is performed.

At least another objective of the present invention is to provide a method for forming an opening capable of effectively cleaning out the etching residue remaining on the surface of the wafer after the etching process is performed to form the opening.

To achieve these and other advantages and in accordance with the purpose of the invention, as embodied and broadly described herein, the invention provides a wafer cleaning process for being applied on a wafer after an etching process is performed on the wafer, wherein the wafer has a wafer center, a wafer radius and a wafer circumference. The wafer cleaning process comprises a step of dispensing a cleaning solution over the wafer by using a dispenser while the dispenser is moving back and forth along a swing path over the wafer around the wafer center, wherein the wafer center is projected to a midpoint of the swing path.

In the present invention, the dispenser moves along the swing path in a dispensing region over the wafer center and the dispensing region covers a region radiatively extending from the wafer center toward to the wafer circumference for about 0-30 percentage of the wafer radius. More specifically, the dispenser moves along the swing path in a dispensing region over the wafer center and the dispensing region covers a region radiatively extending from the wafer center toward to the wafer circumference for about 0-5 percentage of the wafer radius. Furthermore, while the dispenser is dispensing the cleaning solution, the wafer is rotating along an axis penetrating through the wafer center. Also, the wafer can be rotating in a clockwise direction or a counter-clockwise direction.

The present invention also provides a method for forming an opening suitable for a wafer having a dielectric layer and a hard mask layer formed thereon, wherein the wafer possesses a wafer center, a wafer circumference, a wafer radius and the hard mask layer is located on the dielectric layer. The method comprises steps of performing an etching process to patterning the hard mask layer and the dielectric layer to form an opening in the dielectric layer and then performing a wafer cleaning process to dispense a cleaning solution over the wafer while the dispenser is moving back and forth along a swing path over the wafer around the wafer center, wherein the wafer center is projected to a midpoint of the swing path.

In the present invention, the dispenser moves along the swing path in a dispensing region over the wafer center and the dispensing region covers a region radiatively extending from the wafer center toward to the wafer circumference for about 0-30 percentage of the wafer radius. More specifically, the dispenser moves along the swing path in a dispensing region over the wafer center and the dispensing region covers a region radiatively extending from the wafer center toward to the wafer circumference for about 0-5 percentage of the wafer radius. Furthermore, while the dispenser is dispensing the cleaning solution, the wafer is rotating along an axis penetrating through the wafer center. Also, the wafer can be rotating in a clockwise direction or a counter-clockwise direction. Moreover, the opening includes a trench, a via opening and a metal damascene opening. In addition, the hard mask layer includes a metal hard mask layer and the metal hard mask layer can be made of titanium nitride.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

The present invention is detail described by using of one of the preferred embodiment in which the present invention is applied to a method for forming a dual damascene opening. However, the present invention is not limited to be only applied to the method for forming dual damascene opening and the scope of the present invention is not limited by the method of forming dual damascene opening as recited herein.

Figure 1A:
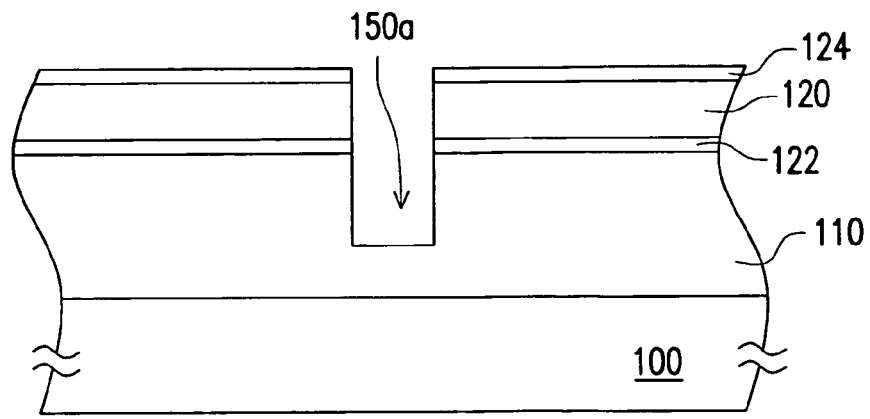
FIGS. 1A through 1C are cross-sectional views of a method for forming a dual damascene opening according to one preferred embodiment of the present invention.
Figure 1B:
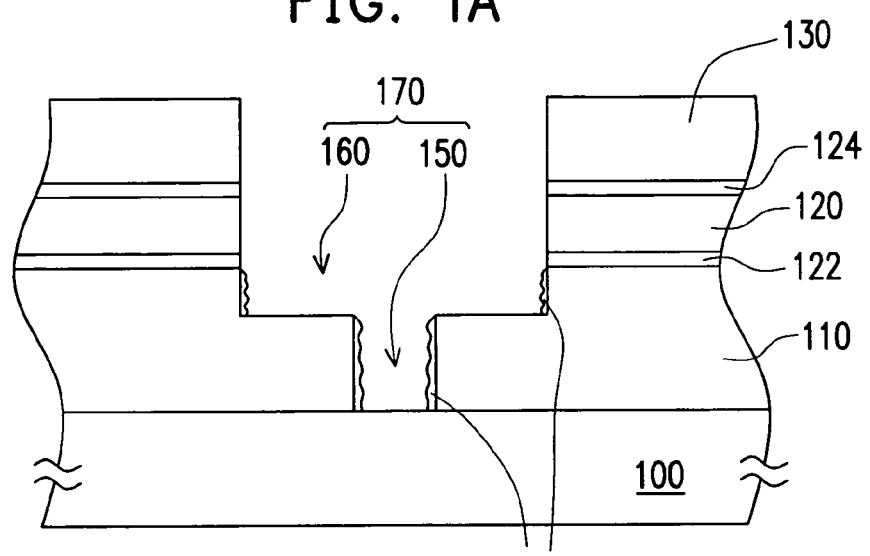
Figure 1C:
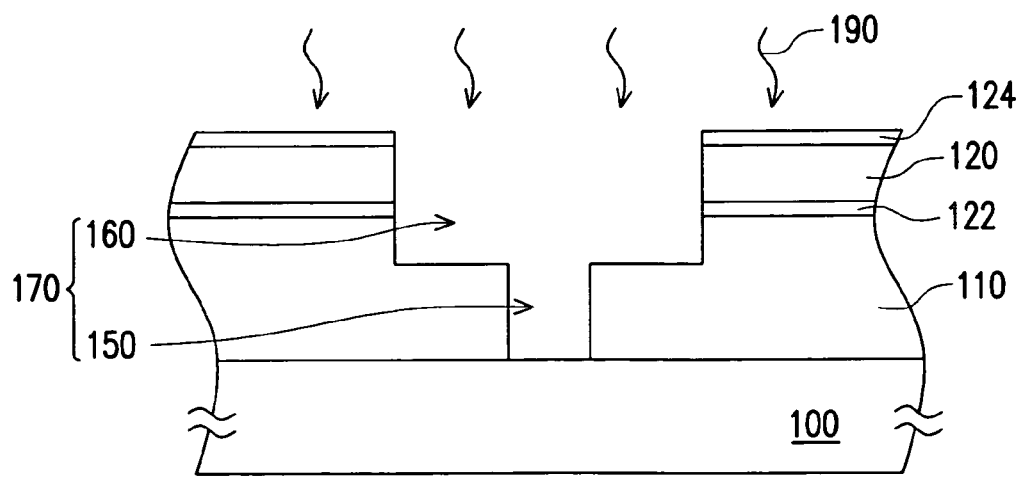

FIGS. 1A through 1C are cross-sectional views of a method for forming a dual damascene opening according to one preferred embodiment of the present invention. As shown in FIG. 1A, a substrate 100 having several devices formed therein is provided. A dielectric layer 110 is formed on the substrate 100. The dielectric layer 110 can be, for example but not limited to, formed from silicon oxide or silicon-based low dielectric constant material, such as HSQ (hydrogen silsesquioxane) or MSQ (methylsesquioxane). A hard mask layer 120 is formed on the dielectric layer 110. The hard mask layer 120 can be, for example but not limited to, a metal hard mask layer made of titanium nitride. While the hard mask layer 120 is made of titanium nitride, there exist intermediate layers 122 and 124 made of inorganic material and located on and under the hard mask layer 120 respectively. The intermediate layers 122 and 124 possess the barrier function and the capability of increasing the adhesion of the hard mask layer 120.

Thereafter, the hard mask layer 120 is patterned and a portion of the dielectric layer 110 is etched to form a via pre-opening 150a which is located at a position for forming via hole in later process step.

As shown in FIG. 1B, a patterned photoresist layer 130 used for defining a trench is formed on the hard mask layer 120. By using the patterned photoresist layer 130 as a mask, the hard mask layer 120 is patterned and the dielectric layer 110 is etched to deepen the via pre-opening 150a to be a via hole 150 and to simultaneously form a trench 160 over the via hole 150. Then, the photoresist layer 130 is removed. Therefore, the via hole and the trench 160 together form a dual damascene opening 170 and there are etching residues 180 remains on the sidewall of the dual damascene opening 170.

Figure 2A:
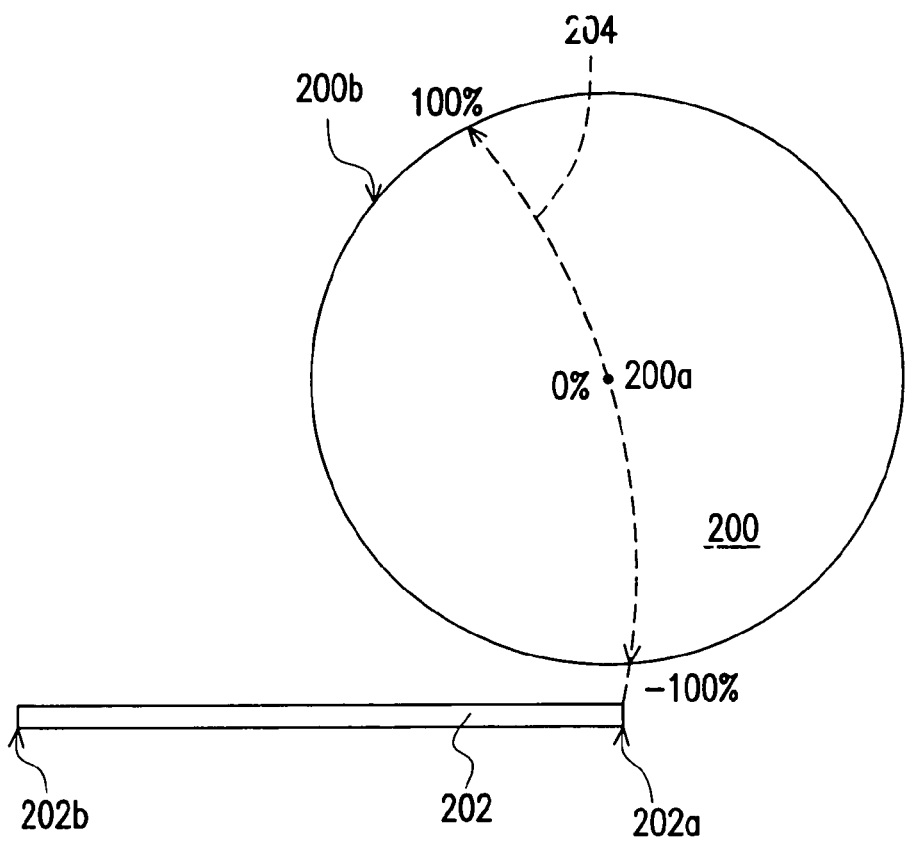
FIG. 2A is a top view of a wafer cleaning process.
Figure 2B:
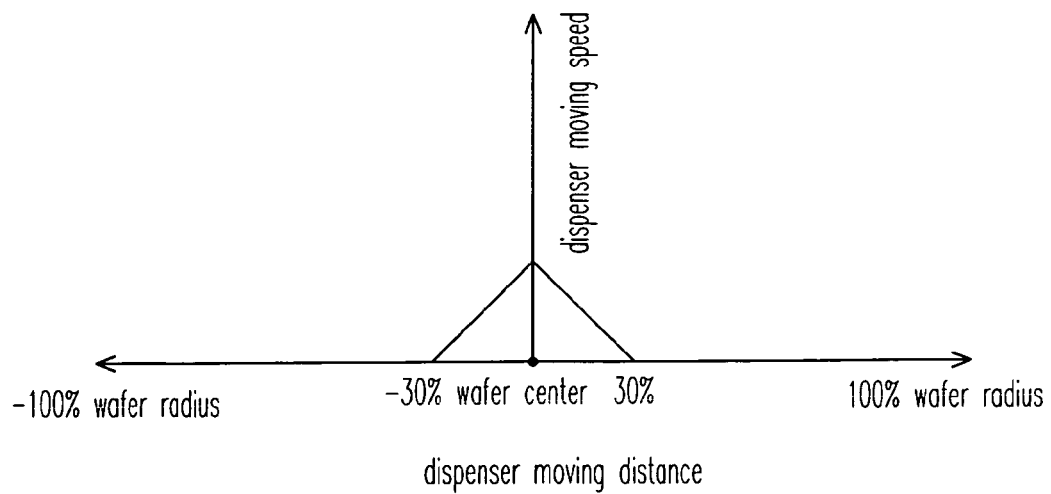
FIG. 2B is a diagram showing the relationship between the moving speed of the cleaning dispenser and the swing direction.

FIG. 2A is a top view of a wafer cleaning process. FIG. 2B is a diagram showing the relationship between the moving speed of the cleaning dispenser and the swing direction. As shown in FIGS. 1C, 2A and 2B, in order to clean out the etching residue 180 remaining on the sidewall of the opening 170, it is necessary to perform a wafer cleaning process 190 for dispensing a cleaning solution over the wafer (including the substrate 100) to clean out the etching residue 180. The cleaning solution used in the wafer cleaning process 190 can be, for example, an aqueous solution containing a surfactant and the surfactant may be a quarternary ammonium salt.

Moreover, as shown in FIGS. 2A and 2B, the aforementioned cleaning solution is delivered to a dispenser 202a through a pipe 202, wherein the dispenser 202a is located at one end of the pipe 202. The wafer cleaning process is performed by dispensing the cleaning solution over the wafer 200 by using the dispenser 202a while the dispenser 202a is moving back and forth along a swing path 204. As shown in FIG. 2A, the wafer center 200a is projected to the midpoint of the swing path 204 and the swing path is radiatively extending from the wafer center 200a to the wafer circumference 200b. That is, the dispenser 202a is moving along a swing path 204 with a midpoint directly over the wafer center 200a and the swing path 204 is within a dispensing region around the wafer center during the wafer cleaning process. Furthermore, in order to increase the cleaning efficiency and the distribution uniformity of the cleaning solution over the wafer, the wafer 200 is rotating along an axis penetrating through the wafer center 200a during the wafer cleaning process is performed. Also, the rotation direction can be a counter-clockwise direction or a clockwise direction. In this embodiment, the swing path 204 is an arc shape path obtained by drawing an arc over the wafer 200 with the use of one end 202b of the pipe 202 as a dispenser moving center and the length of the pipe as a radius, wherein the end 202b is opposite to the end having the dispenser 202a. However, the swing path is not limited to the arc path 204 defined above. That is, in application, the swing path of the dispenser possesses a feature that the midpoint of the swing path is right over the wafer center and the dispenser moves along the swing path back and forth over the wafer surface.

As shown in FIG. 2B, in the present invention, the dispenser 202a moves along the swing path 204 within a dispensing region radiatively extending from the wafer center 202a toward to the wafer circumference 200b for about 30 percentage of the wafer radius. Referring to FIG. 2B, while the dispenser 202a is located at a position away from the wafer center 200a for about 30 percentage of the wafer radius, the moving speed of the dispenser 202a is zero. With the dispenser moving toward to the position right over the wafer center, the moving speed of the dispenser 202a is increased. While the dispenser 202a is passing through the wafer center 200a, the moving speed of the dispenser 202a is reaching the highest value. Thereafter, with the dispenser 202a moving away from the position right over the wafer center, the moving speed of the dispenser is decreased to be zero. The dispenser moves back and forth along the swing path 204 in a dispensing region over the wafer center and the dispensing region covers a region radiatively extending from the wafer center 200a toward to the wafer circumference 200b for about 0-30 percentage of the wafer radius. Preferably, the dispenser moves back and forth along the swing path 204 in a dispensing region over the wafer center and the dispensing region covers a region radiatively extending from the wafer center 200a toward to the wafer circumference 200b for about 0-5 percentage of the wafer radius.

Figure 3:
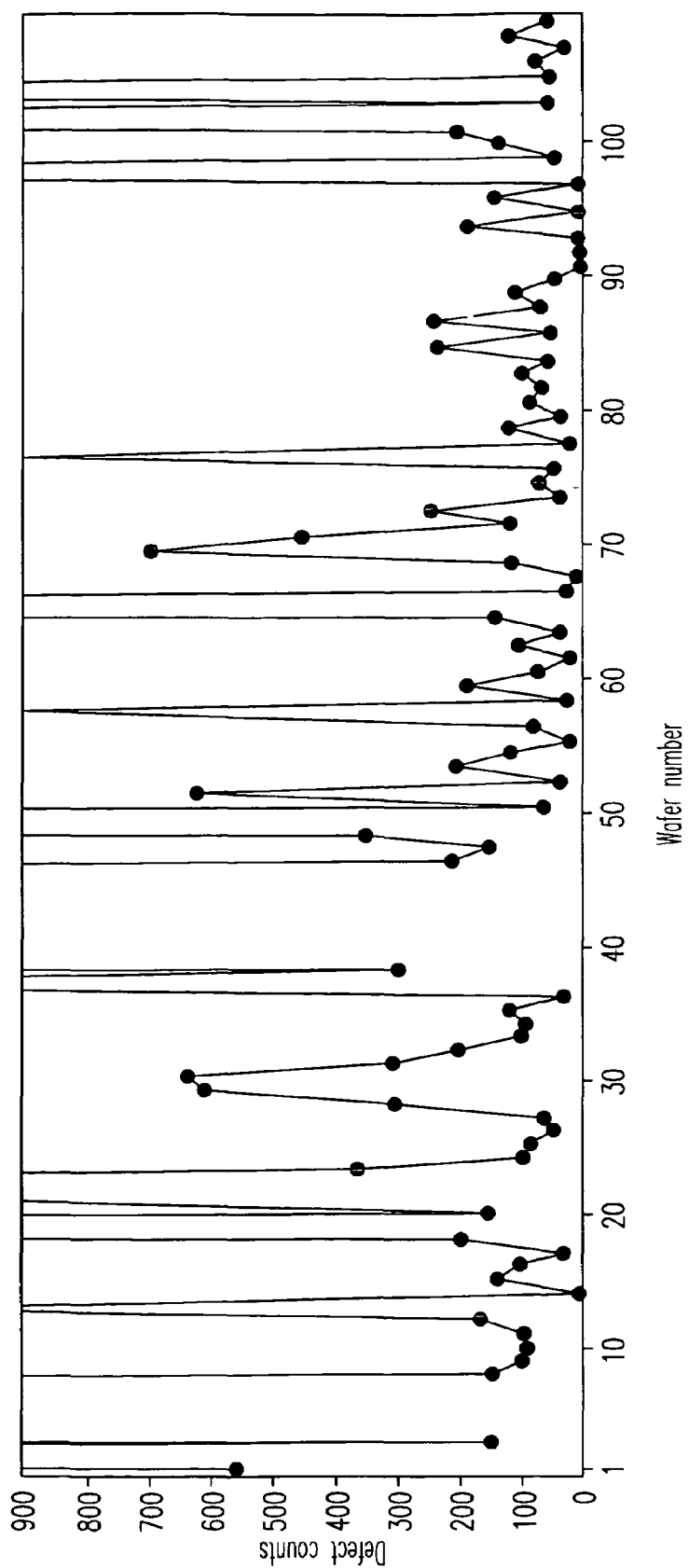
FIG. 3 is a statistic diagram showing the defects found on the wafers after the wafer cleaning process is performed with a dispensing region radiatively extending from the wafer center toward to the wafer circumference for about 80 percentage of the wafer radius.
Figure 4:
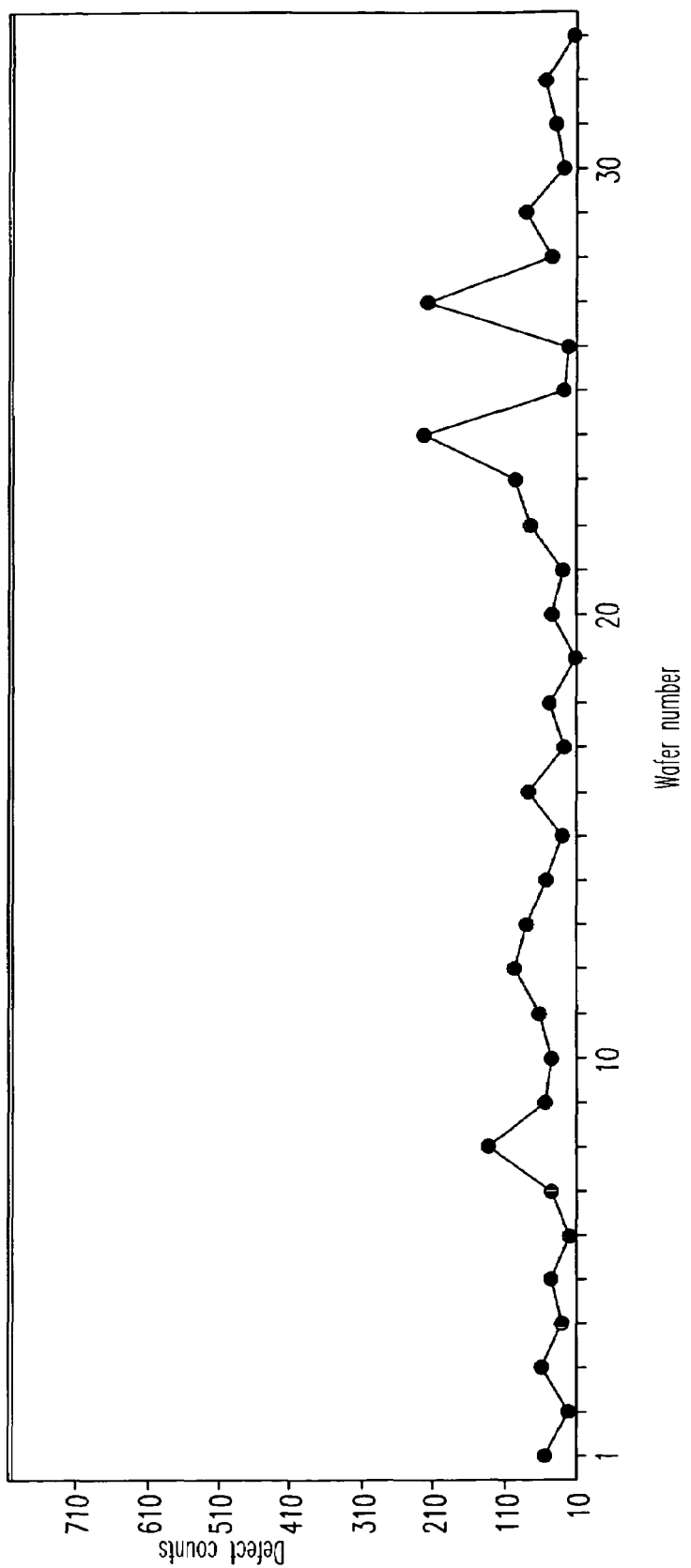
FIG. 4 is a statistic diagram showing the defects found on the wafers after the wafer cleaning process is performed with a dispensing region radiatively extending from the wafer center toward to the wafer circumference for about 30 percentage of the wafer radius.

FIG. 3 is a statistic diagram showing the defects found on the wafers after the wafer cleaning process is performed with a dispensing region radiatively extending from the wafer center toward to the wafer circumference for about 80 percentage of the wafer radius. FIG. 4 is a statistic diagram showing the defects found on the wafers after the wafer cleaning process is performed with a dispensing region radiatively extending from the wafer center toward to the wafer circumference for about 30 percentage of the wafer radius. By comparing to the defect counts shown in FIG. 4 with the defect counts shown in FIG. 3, the defect counts shown in FIG. 4 is relatively small. It is showing that the dispenser only moving in a dispensing region over the wafer and closer to the wafer center possesses a better cleaning result and a more stable cleaning effect.

Altogether, in the wafer cleaning process of the present invention, it is unnecessary to dispense the cleaning solution all over the wafer (the dispensing region is radiatively extending from the wafer center to the wafer circumference for about 80 percentage of the radius). That is, the dispenser for dispensing the cleaning solution over the wafer only moves back and forth along the swing path within a dispensing region radiatively extending from the wafer center to the wafer circumference for about 0-30 percentage of the wafer radius so as to obtain a better cleaning result and a relatively stable cleaning effect. Therefore, the problem of the etching residue remaining on the wafer after the etching process is performed can be solved.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A wafer cleaning process for being applied on a wafer after an etching process is performed on the wafer, wherein the wafer has a wafer center, a wafer radius and a wafer circumference, the wafer cleaning process comprising:
    dispensing a cleaning solution along a dispensing path by using a dispenser moving back and forth around the wafer center, wherein the wafer center is projected to a midpoint of the dispensing path and the dispenser moves along the dispensing path in a dispensing region covering a region radiatively extending from the wafer center toward to the wafer circumference for about 0-30 percentage of the wafer radius.

2. The wafer cleaning process of claim 1, wherein the dispenser moves along the dispensing path in the dispensing region over the wafer center and the dispensing region covers a region radiatively extending from the wafer center toward to the wafer circumference for about 0-5 percentage of the wafer radius.

3. The wafer cleaning process of claim 1, wherein, while the dispenser is dispensing the cleaning solution, the wafer is rotating along an axis penetrating through the wafer center.

4. The wafer cleaning process of claim 3, wherein the wafer is rotating in a clockwise direction.

5. The wafer cleaning process of claim 3, wherein the wafer is rotating in a counter-clockwise direction.

6. A method for forming an opening suitable for a wafer having a dielectric layer and a hard mask layer formed thereon, wherein the wafer possesses a wafer center, a wafer circumference, a wafer radius and the hard mask layer is located on the dielectric layer, the method comprising:
    performing an etching process to patterning the hard mask layer and the dielectric layer to form an opening in the dielectric layer;
    performing a wafer cleaning process to dispense a cleaning solution along a dispensing path only within the wafer while the dispenser is moving back and forth around the wafer center, wherein the wafer center is projected to a midpoint of the dispensing path and the dispenser moves along the dispensing path in a dispensing region covering a region radiatively extending from the wafer center toward to the wafer circumference for about 0-30 percentage of the wafer radius.

7. The method of claim 6, wherein the dispenser moves along the dispensing path in a dispensing region over the wafer center and the dispensing region covers a region radiatively extending from the wafer center toward to the wafer circumference for about 0-5 percentage of the wafer radius.

8. The method of claim 6, wherein, while the dispenser is dispensing the cleaning solution, the wafer is rotating along an axis penetrating through the wafer center.

9. The method of claim 8, wherein the wafer is rotating in a clockwise direction.

10. The method of claim 8, wherein the wafer is rotating in a counter-clockwise direction.

11. The method of claim 6, wherein the opening includes a trench, a via opening and a metal damascene opening.

12. The method of claim 6, wherein the hard mask layer includes a metal hard mask layer.

13. The method of claim 12, wherein the metal hard mask layer is made of titanium nitride.

\* \* \* \* \*